United States Patent
Yamamoto

(10) Patent No.: US 11,446,771 B2
(45) Date of Patent: Sep. 20, 2022

(54) METHOD FOR PRODUCING WAFERS USING ULTRASOUND

(71) Applicant: DISCO CORPORATION, Tokyo (JP)

(72) Inventor: Ryohei Yamamoto, Tokyo (JP)

(73) Assignee: DISCO CORPORATION, Tokyo (JP)

(*) Notice: Subject to any disclaimer, the term of this patent is extended or adjusted under 35 U.S.C. 154(b) by 517 days.

(21) Appl. No.: 16/685,393

(22) Filed: Nov. 15, 2019

(65) Prior Publication Data

US 2020/0156190 A1    May 21, 2020

(30) Foreign Application Priority Data

Nov. 21, 2018 (JP) .............................. JP2018-218399

(51) Int. Cl.
| | | |
|---|---|---|
| *H01L 29/16* | (2006.01) | |
| *B23K 26/53* | (2014.01) | |
| *B23K 26/00* | (2014.01) | |
| *B23K 26/02* | (2014.01) | |
| B23K 103/00 | (2006.01) | |
| B23K 101/40 | (2006.01) | |

(52) U.S. Cl.
CPC .......... *B23K 26/53* (2015.10); *B23K 26/0006* (2013.01); *B23K 26/0093* (2013.01); *B23K 26/02* (2013.01); *H01L 29/1608* (2013.01); B23K 2101/40 (2018.08); B23K 2103/52 (2018.08)

(58) Field of Classification Search
CPC ......... H01L 21/02002; H01L 21/02021; H01L 21/02027; H01L 21/0203; H01L 21/78; H01L 21/02035; H01L 21/02005; H01L 21/02008; H01L 21/0201; H01L 29/1608; H01L 21/02378; H01L 21/67092; H01L 22/34; B23K 26/53; B23K 26/02; B23K 26/0006; B23K 26/0093; B23K 2101/40; B23K 26/38; B28D 5/047
See application file for complete search history.

(56) References Cited

U.S. PATENT DOCUMENTS

| | | | |
|---|---|---|---|
| 9,481,051 B2 * | 11/2016 | Hirata | B23K 26/0622 |
| 10,369,659 B2 * | 8/2019 | Hirata | B28D 5/0011 |
| 2020/0075414 A1 * | 3/2020 | Sekiya | B23K 26/0006 |
| 2020/0075415 A1 * | 3/2020 | Sekiya | H01L 21/7813 |

FOREIGN PATENT DOCUMENTS

| | | |
|---|---|---|
| JP | 2000094221 A | 4/2000 |
| JP | 2011060862 A | 3/2011 |
| JP | 2016111143 A | 6/2016 |

* cited by examiner

*Primary Examiner* — Thanh Y. Tran
(74) *Attorney, Agent, or Firm* — Greer Burns & Crain Ltd.

(57) ABSTRACT

A wafer producing method for producing a wafer from an ingot, the ingot being previously formed with a separation layer along which the wafer is to be separated from the ingot. The wafer producing method includes a first ultrasonic vibration applying step of applying ultrasonic vibration to a given area of the ingot at a high density to thereby form a partially broken portion where a part of the separation layer is broken, a second ultrasonic vibration applying step of applying the ultrasonic vibration to the whole area of the ingot larger than the given area at a low density, after performing the first ultrasonic vibration applying step, thereby forming a fully broken portion where the separation layer is fully broken in such a manner that breaking starts from the partially broken portion, and a separating step of separating the wafer from the ingot along the fully broken portion.

4 Claims, 7 Drawing Sheets

METHOD FOR PRODUCING WAFERS USING ULTRASOUND

BACKGROUND OF THE INVENTION

Field of the Invention

The present invention relates to a wafer producing method for producing a wafer from an ingot after forming a separation layer inside the ingot by setting a focal point of a laser beam having a transmission wavelength to the ingot inside the ingot at a predetermined depth from one end surface of the ingot, the predetermined depth corresponding to the thickness of the wafer to be produced, and next applying the laser beam to the ingot.

Description of the Related Art

Various devices such as integrated circuits (ICs), large scale integrations (LSIs), and light emitting diodes (LEDs) are formed by forming a functional layer on the front side of a wafer formed of silicon (Si), sapphire ($AL_2O_3$), or the like and partitioning this functional layer into a plurality of separate regions along a plurality of crossing division lines. The division lines of the wafer having these devices are processed by a processing apparatus such as a cutting apparatus and a laser processing apparatus to thereby divide the wafer into a plurality of individual device chips respectively corresponding to the devices. The device chips thus obtained are used in various electrical equipment such as mobile phones and personal computers. Further, power devices or optical devices such as LEDs are formed by forming a functional layer on the front side of a wafer formed of hexagonal single-crystal silicon carbide (SiC) and partitioning this functional layer into a plurality of separate regions along a plurality of crossing division lines.

In general, the wafer on which the devices are to be formed is produced by slicing an ingot with a wire saw. Both sides of the wafer sliced from the ingot are polished to a mirror finish (see Japanese Patent Laid-Open No. 2000-094221, for example). However, when the ingot is cut by the wire saw and both sides of each wafer are polished to obtain the product, 70% to 80% of the ingot is discarded to cause a problem of poor economy. In particular, a hexagonal single-crystal SiC ingot has high hardness and it is therefore difficult to cut this ingot with the wire saw. Accordingly, considerable time is required for cutting of the ingot, causing a reduction in productivity. Furthermore, since this ingot is high in unit price, there is a problem in efficiently producing a wafer in this prior art.

A technique for solving this problem has been proposed by the present applicant. This technique includes the steps of setting the focal point of a laser beam having a transmission wavelength to hexagonal single-crystal SiC inside an SiC ingot, next applying the laser beam to the ingot as scanning the laser beam on the ingot to thereby form a separation layer in a predetermined separation plane inside the ingot, and next separating a wafer from the ingot along the separation layer (see Japanese Patent Laid-Open No. 2016-111143, for example). Further, a similar technique has also been proposed. This technique includes the steps of setting the focal point of a laser beam having a transmission wavelength to hexagonal single-crystal Si inside an Si ingot at a predetermined depth from an end surface of the ingot, the predetermined depth corresponding to the thickness of a wafer to be produced, next applying the laser beam to the ingot as scanning the laser beam on the ingot to thereby form a modified portion at this predetermined depth inside the ingot, and next separating the wafer from the ingot along this modified portion (see Japanese Patent Laid-Open No. 2011-060862, for example).

SUMMARY OF THE INVENTION

According to the techniques described in Japanese Patent Laid-Open No. 2016-111143 and Japanese Patent Laid-Open No. 2011-060862 mentioned above, the amount of the ingot to be discarded in producing the wafer from the ingot is reduced as compared with the case of using a wire saw to slice the ingot, so that some effect can be exhibited against the problem of poor economy. However, it is not easy to separate the wafer from the ingot along the separation layer or the modified portion formed inside the ingot by applying a laser beam, so that there still remains a problem in production efficiency.

It is therefore an object of the present invention to provide a wafer producing method which can efficiently produce a wafer from a hexagonal single-crystal SiC ingot.

In accordance with an aspect of the present invention, there is provided a wafer producing method for producing a wafer from an ingot after forming a separation layer inside the ingot by setting a focal point of a laser beam having a transmission wavelength to the ingot inside the ingot at a predetermined depth from one end surface of the ingot, the predetermined depth corresponding to a thickness of the wafer to be produced, and next applying the laser beam to the ingot, the wafer producing method including: a first ultrasonic vibration applying step of applying ultrasonic vibration to a given area of the ingot at a first density to thereby form a partially broken portion where a part of the separation layer is broken; a second ultrasonic vibration applying step of applying the ultrasonic vibration to a whole area of the ingot larger than the given area at a second density lower than the first density, after performing the first ultrasonic vibration applying step, thereby forming a fully broken portion where the separation layer is fully broken in such a manner that breaking starts from the partially broken portion; and a separating step of separating the wafer from the ingot along the fully broken portion.

Preferably, the ultrasonic vibration is applied through a layer of water to the ingot in the first ultrasonic vibration applying step and the second ultrasonic vibration applying step.

Preferably, the ingot includes a hexagonal single-crystal SiC ingot having a c-axis and a c-plane perpendicular to the c-axis, and the separation layer is composed of a modified portion and cracks extending isotropically from the modified portion along the c-plane, the modified portion being formed by setting a focal point of a laser beam having a transmission wavelength to hexagonal single-crystal SiC inside the SiC ingot at a predetermined depth from the one end surface of the SiC ingot, the predetermined depth corresponding to the thickness of the wafer to be produced, and next applying the laser beam to the SiC ingot to thereby decompose SiC into Si and C.

Preferably, the c-axis is inclined at an off angle with respect to a normal to the one end surface of the SiC ingot, the off angle being formed between the c-plane and the one end surface, the focal point of the laser beam is moved in a direction perpendicular to a direction of formation of the off angle to thereby continuously form the modified portion in the direction perpendicular to the direction of formation of the off angle, and the focal point of the laser beam is indexed in the direction of formation of the off angle in a range not greater than a range of formation of the cracks, whereby a plurality of linear modified portions are arranged side by side in the direction of formation of the off angle in such a manner that the cracks extending from any adjacent ones of the plurality of linear modified portions are overlapped.

According to the wafer producing method of the present invention, the amount of the ingot to be discarded in producing the wafer from the ingot can be greatly reduced as compared with the case of using a wire saw to slice the ingot. Further, the first ultrasonic vibration applying step is performed to apply ultrasonic vibration to a part of the ingot at a high density, thereby forming the partially broken portion. Thereafter, the second ultrasonic vibration applying step is performed to apply ultrasonic vibration to the whole of the ingot at a low density, thereby forming the fully broken portion as spread from the partially broken portion. Thus, the fully broken portion is formed from the separation layer previously formed inside the ingot. Accordingly, the wafer to be produced can be separated from the ingot along the fully broken portion easily and efficiently.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
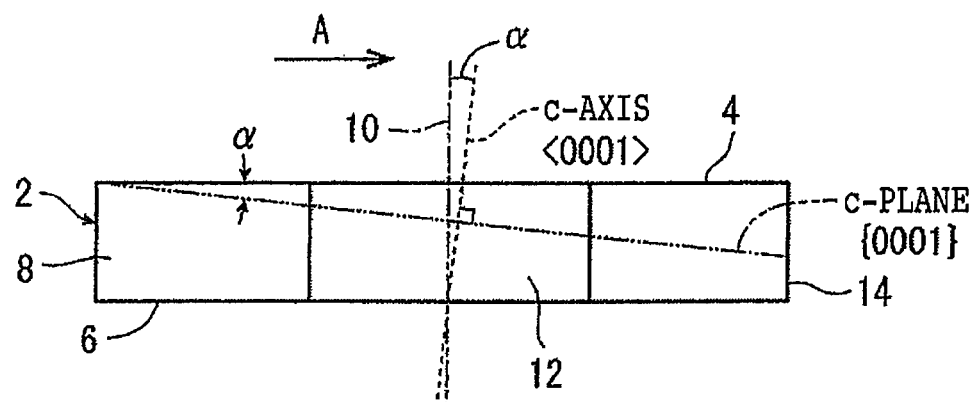
FIG. 1A is an elevational view of an ingot formed of hexagonal single-crystal SiC.
Figure 1B:
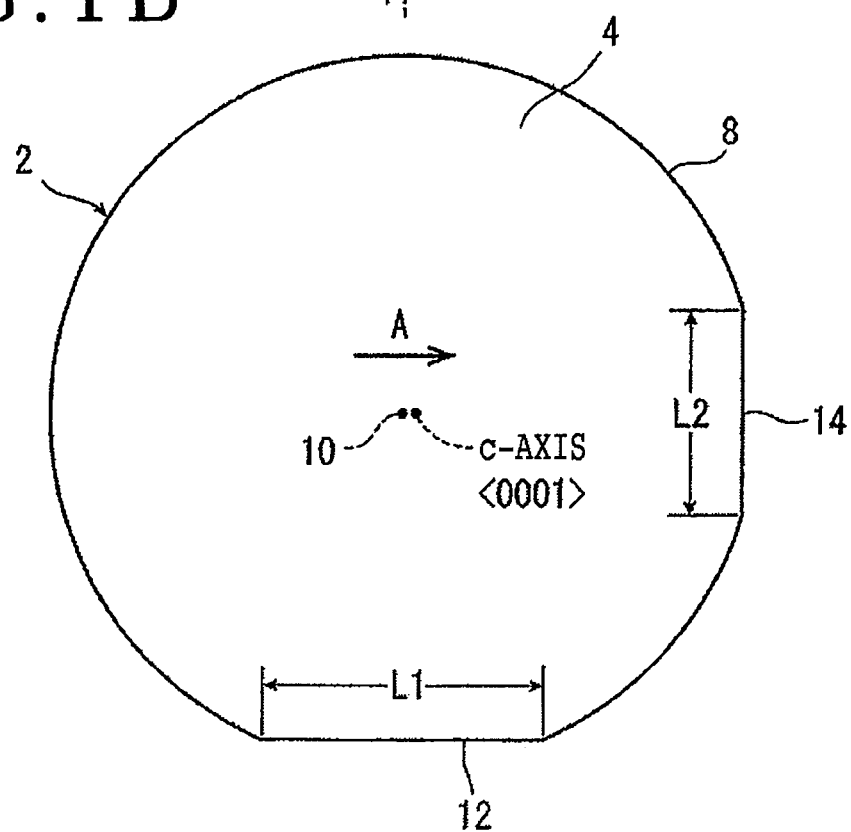
FIG. 1B is a plan view of the ingot depicted in FIG. 1A.

A wafer producing method according to a preferred embodiment of the present invention will now be described in detail with reference to the attached drawings. FIGS. 1A and 1B depict an ingot 2 according to this preferred embodiment. The ingot 2 is a hexagonal single-crystal SiC ingot having a substantially cylindrical shape in this preferred embodiment. For example, the ingot 2 has a diameter of approximately 100 mm. The ingot 2 has a substantially circular first end surface 4, a substantially circular second end surface 6 opposite to the first end surface 4, a substantially cylindrical surface 8 formed so as to connect the first end surface 4 and the second end surface 6, a c-axis (<0001> direction) extending from the first end surface 4 to the second end surface 6, and a c-plane ({0001} plane) perpendicular to the c-axis. In the ingot 2, the c-axis is inclined by an off angle $\alpha$ (e.g., $\alpha$=1, 3, or 6 degrees) with respect to a normal 10 to the first end surface 4. The off angle $\alpha$ is formed between the c-plane and the first end surface 4. The direction of formation of the off angle $\alpha$ (i.e., the direction of inclination of the c-axis) is depicted by an arrow A in FIGS. 1A and 1B. Further, the cylindrical surface 8 of the ingot 2 is formed with a first orientation flat 12 and a second orientation flat 14, which are rectangular as viewed in side elevation and function to indicate crystal orientation. The first orientation flat 12 is parallel to the direction A of formation of the off angle $\alpha$, and the second orientation flat 14 is perpendicular to the direction A of formation of the off angle $\alpha$. As depicted in FIG. 1B, which is a plan view of the ingot 2, the length L2 of the second orientation flat 14 is set shorter than the length L1 of the first orientation flat 12 (L1>L2). Accordingly, the direction A of formation of the off angle $\alpha$ can be determined irrespective of whether or not the first end surface 4 is the front side of the ingot 2. The ingot to be applied to the wafer producing method according to the present invention is not limited to the hexagonal single-crystal SiC ingot 2 mentioned above, but the ingot applicable may be an ingot having a c-axis not inclined with respect to the normal to the first end surface, that is, having a configuration such that the off angle $\alpha$ between the c-plane and the first end surface is 0 degrees (i.e., having a configuration such that the normal to the first end surface coincides with the c-axis).

In the wafer producing method according to this preferred embodiment, a separation layer forming step is first performed to form a separation layer by setting a focal point of a laser beam having a transmission wavelength to the ingot 2 inside the ingot 2 at a predetermined depth from the first end surface 4 of the ingot 2, the predetermined depth corresponding to the thickness of a wafer to be produced, and next applying the laser beam to the ingot 2. The separation layer forming step will now be described with reference to FIGS. 2 to 4B.

Figure 2:
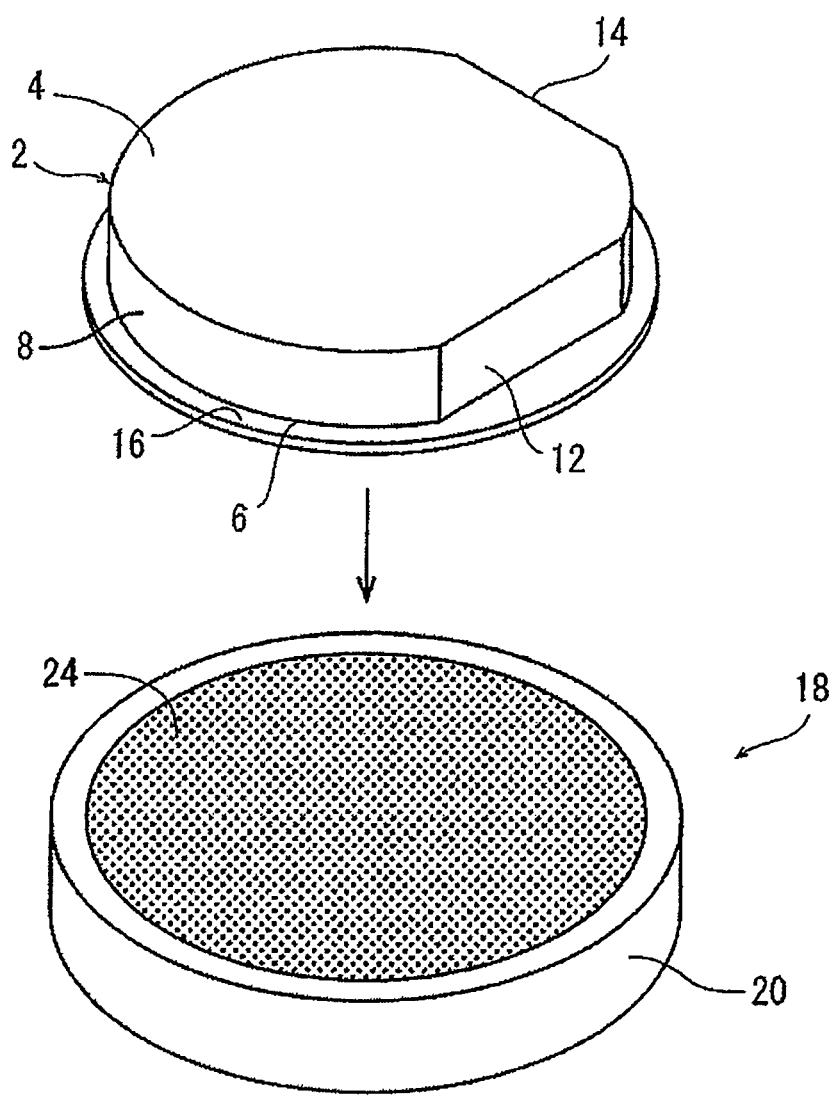
FIG. 2 is a perspective view depicting a manner of mounting a substrate to the ingot depicted in FIGS. 1A and 1B and then placing the ingot with the substrate on a chuck table.

In performing the separation layer forming step, a circular substrate 16 is first mounted through an adhesive or the like to the second end surface 6 of the ingot 2 as depicted in FIG. 2. Thereafter, the ingot 2 with the substrate 16 is transferred to a laser processing apparatus 18, a part of which is depicted in FIG. 2. The laser processing apparatus 18 includes a chuck table 20. The chuck table 20 has an upper surface formed with a circular vacuum chuck 24. The vacuum chuck 24 is formed of porous ceramic allowing the pass of air. The size (diameter) of the vacuum chuck 24 is slightly smaller than that of the substrate 16. Suction means (not depicted) is connected to the vacuum chuck 24. The ingot 2 with the substrate 16 as transferred to the laser processing apparatus 18 is placed on the vacuum chuck 24 of the chuck table 20 in the condition where the substrate 16 is in contact with the upper surface of the vacuum chuck 24. Accordingly, the first end surface 4 of the ingot 2 is oriented upward on the chuck table 20. Thereafter, the suction means is operated to hold the ingot 2 with the substrate 16 on the vacuum chuck 24 under suction. In the present invention, the substrate 16 to be mounted to the ingot 2 is not essential. That is, the substrate 16 may be omitted, provided that the vacuum chuck 24 of the chuck table 20 has a size and shape capable of directly holding the ingot 2 on the vacuum chuck 24 under suction.

After thus holding the ingot 2 on the chuck table 20, a focal point of a laser beam having a transmission wavelength to the single-crystal SiC forming the ingot 2 is set inside the ingot 2 at a predetermined depth from the first end surface 4 of the ingot 2, in which the predetermined depth corresponds to the thickness of a wafer to be produced. Thereafter, the laser beam is applied to the first end surface 4 of the ingot 2, thereby forming a separation layer in which SiC is decomposed into Si and carbon (C), and cracks are formed isotropically in the c-plane. The first end surface 4 is a mirror surface previously formed by performing grinding and polishing to remove roughness. The separation layer forming step will now be described in more detail with reference to FIGS. 3A to 4B.

Figure 3A:
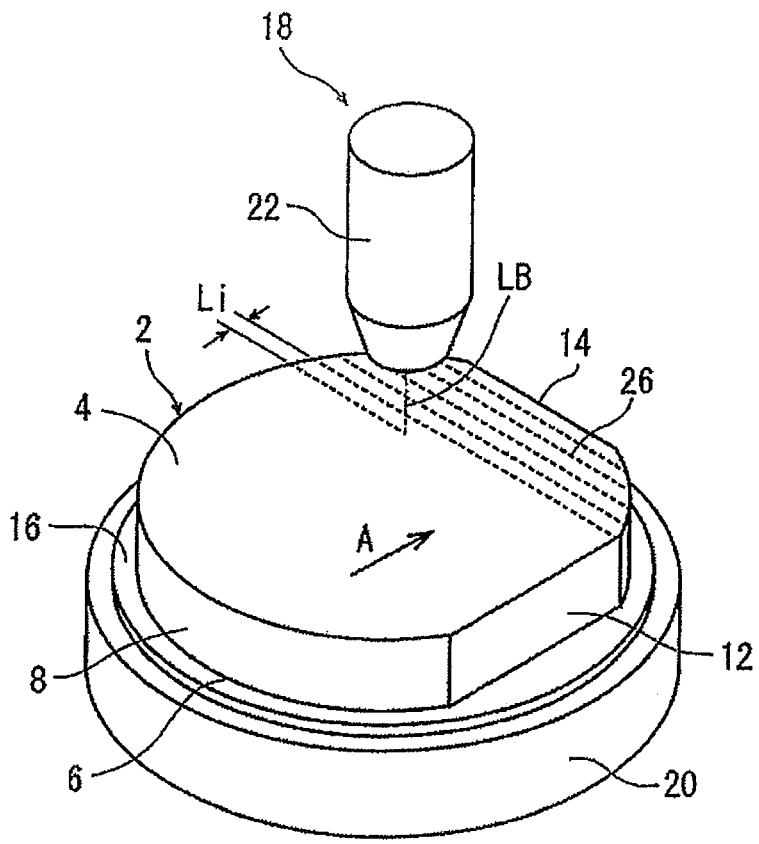
FIG. 3A is a perspective view depicting a step of forming a separation layer inside the ingot.

As depicted in FIG. 3A, the laser processing apparatus 18 (a part of which being depicted) further includes focusing means 22 in addition to the chuck table 20. The focusing means 22 functions to apply a pulsed laser beam LB to the ingot 2. The chuck table 20 is adapted to be rotated about its vertical axis by a motor (not depicted). Further, the chuck table 20 is adapted to be moved by an X moving mechanism (not depicted) in the X direction depicted by an arrow X in FIG. 3A with respect to the focusing means 22. That is, the chuck table 20 is adapted to be fed in the X direction. Further, the chuck table 20 is adapted to be moved by a Y moving mechanism (not depicted) in the Y direction depicted by an arrow Y in FIG. 3A with respect to the focusing means 22, the Y direction being perpendicular to the X direction. That is, the chuck table 20 is adapted to be indexed in the Y direction. The focusing means 22 includes a focusing lens (not depicted) for focusing the pulsed laser beam LB inside the ingot 2 and applying it to the ingot 2. The pulsed laser beam LB is generated from a laser beam applying unit (not depicted) and adjusted in power.

In forming the separation layer in the ingot 2 held on the chuck table 20 under suction, the ingot 2 is imaged by an imaging unit (not depicted) included in the laser processing apparatus 18. That is, the first end surface 4 of the ingot 2 is imaged by the imaging unit to thereby obtain an image of the ingot 2. According to the first orientation flat 12 and the second orientation flat 14 distinguished from each other by viewing the image of the ingot 2, the chuck table 20 is rotated by the motor and also moved by the X moving mechanism and the Y moving mechanism, thereby adjusting the orientation of the ingot 2 to a predetermined orientation and also adjusting the positional relation between the ingot 2 and the focusing means 22 in the XY plane defined by the X direction and the Y direction.

Figure 3B:
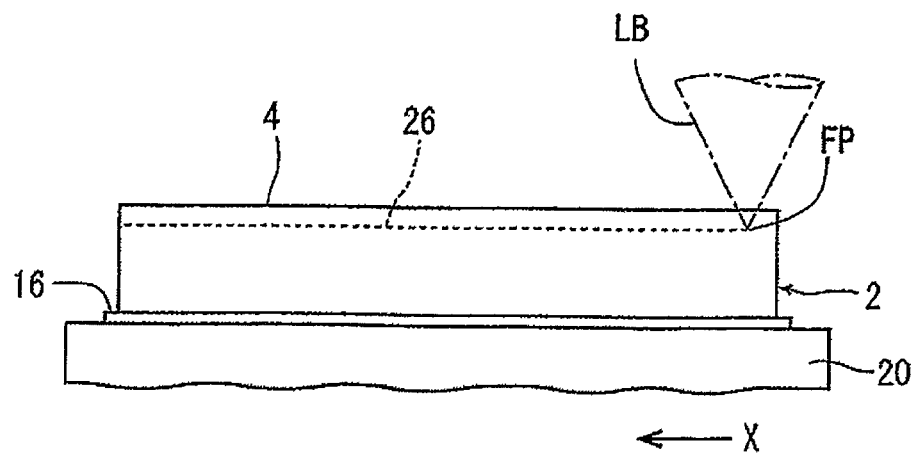
FIG. 3B is an elevational view depicting the step depicted in FIG. 3A.

In adjusting the orientation of the ingot 2 to a predetermined orientation, the second orientation flat 14 is made parallel to the X direction as depicted in FIG. 3A. Accordingly, the direction perpendicular to the direction A of formation of the off angle $\alpha$ is made parallel to the X direction, and the direction A of formation of the off angle $\alpha$ is made parallel to the Y direction. Thereafter, focal position adjusting means (not depicted) included in the laser processing apparatus 18 is operated to vertically move the focusing means 22, thereby setting a focal point FP at a predetermined depth (e.g., 300 µm) from the first end surface 4 of the ingot 2 as depicted in FIG. 3B, in which the predetermined depth corresponds to the thickness of a wafer to be produced. Thereafter, the pulsed laser beam LB having a transmission wavelength to SiC forming the ingot 2 is applied from the focusing means 22 to the ingot 2 as moving the chuck table 20 at a predetermined feed speed in the X direction, i.e., in the direction perpendicular to the direction A of formation of the off angle $\alpha$, thus performing a laser processing operation to form a modified portion or a modified area 26.

Figure 4A:
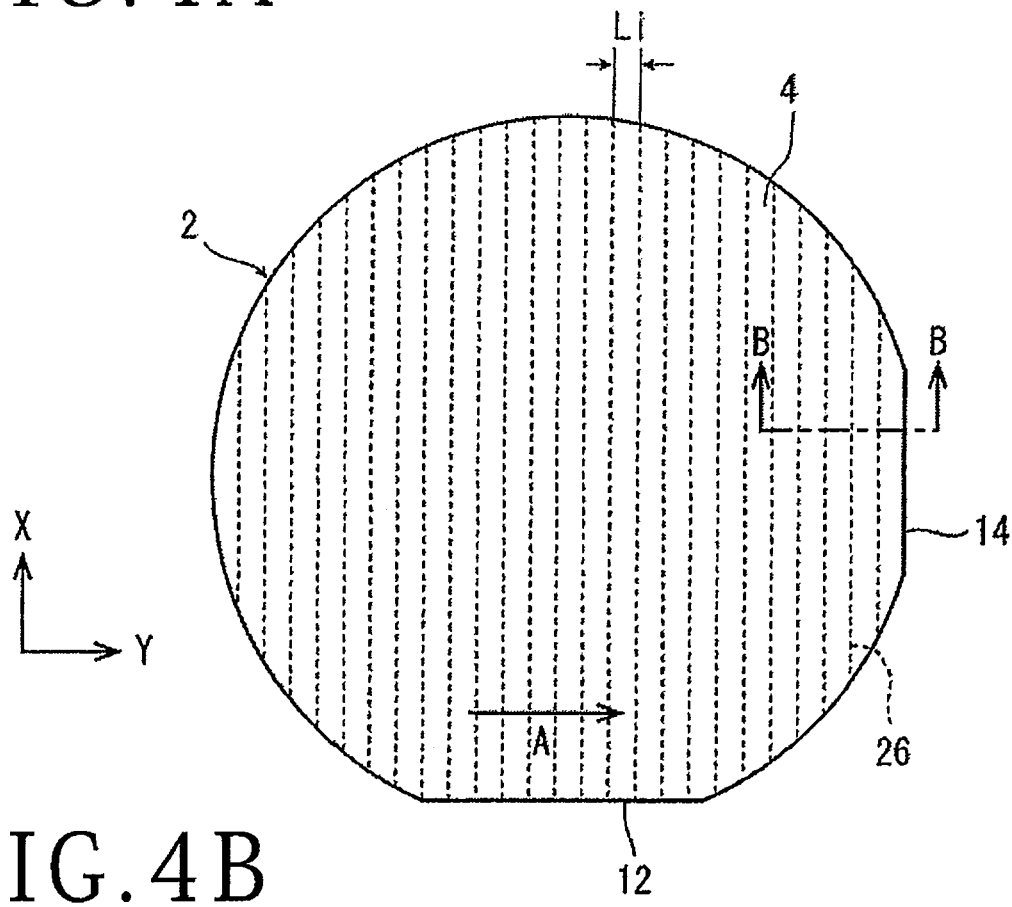
FIG. 4A is a plan view of the ingot in the condition where the separation layer has been formed inside the ingot by performing the step depicted in FIG. 3A.
Figure 4B:
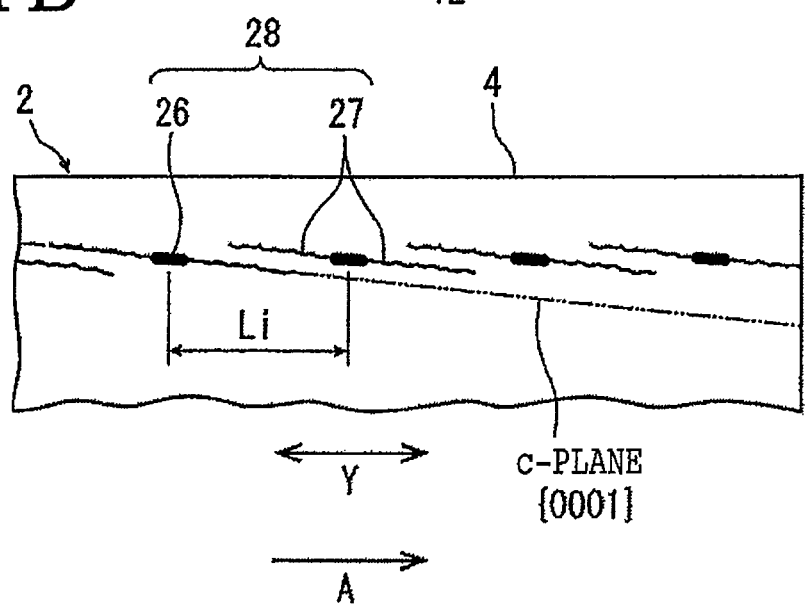
FIG. 4B is a cross section taken along the line B-B in FIG. 4A.

As depicted in FIG. 4A as a plan view of the ingot 2 and in FIG. 4B as a cross section taken along the line B-B in FIG. 4A, the modified portion 26 is continuously formed in the direction perpendicular to the direction A of formation of the off angle $\alpha$ by the application of the pulsed laser beam LB. In this laser processing operation, the pulsed laser beam LB is initially applied to the ingot 2 to thereby decompose SiC into Si and C. Thereafter, the pulsed laser beam LB is next applied to the ingot 2 and absorbed by C previously produced. Then, SiC is decomposed into Si and C in a chain reaction manner with the movement of the chuck table 20 in the X direction. At the same time, cracks 27 are also formed so as to extend isotropically from the modified portion 26 along the c-plane. While the chuck table 20 is moved in the X direction in the laser processing operation for forming the modified portion 26, the focusing means 22 may be moved in the X direction at a predetermined feed speed without moving the chuck table 20.

After performing the laser processing operation to form the modified portion 26 extending in the predetermined direction (X direction) inside the ingot 2 as mentioned above, the chuck table 20 is moved by a predetermined index amount Li in the Y direction, i.e., in the direction A of formation of the off angle $\alpha$ by operating the Y moving mechanism. Accordingly, the ingot 2 and the focal point FP are relatively moved in the Y direction. The predetermined index amount Li (e.g., 250 to 400 µm) is set so as not to exceed the diameter of a circular area defined by the plural cracks 27 extending isotropically. Thus, an indexing operation for indexing the chuck table 20 in the Y direction is performed. Thereafter, the laser processing operation and the indexing operation are repeated to thereby form a plurality of modified portions 26 spaced the predetermined index amount Li in the direction A of formation of the off angle $\alpha$ and also form a plurality of cracks 27 extending isotropically from each modified portion 26 along the c-plane. In this preferred embodiment, the c-axis is inclined with respect to the normal to the first end surface 4 of the hexagonal single-crystal SiC ingot 2, so that the off angle $\alpha$ greater than 0 degrees is formed. Accordingly, the cracks 27 and the cracks 27 adjacent to each other in the direction A of formation of the off angle $\alpha$ are overlapped as viewed in plan. Thus, a separation layer 28 is formed inside the ingot 2 at the predetermined depth from the first end surface 4 of the ingot 2, the predetermined depth corresponding to the thickness of a wafer to be produced, in which the separation layer 28 is composed of the plural modified portions 26 and the plural cracks 27. Accordingly, the separation layer 28 for separating the wafer from the ingot 2 has a reduced strength.

For example, the separation layer forming step of forming the separation layer 28 is performed under the following processing conditions.

Wavelength: 1064 nm
Repetition frequency: 60 kHz
Average power: 1.5 W
Pulse width: 4 ns
Numerical aperture (NA) of the focusing lens: 0.65
Feed speed: 200 mm/s By performing the separation layer forming step, the ingot 2 having the separation layer 28 can be obtained, in which the separation layer 28 is formed inside the ingot 2 at the depth corresponding to the thickness of a wafer to be produced.

After preparing the ingot 2 having the separation layer 28 by performing the separation layer forming step, a broken portion is formed from the separation layer 28 as a break start point, and the wafer to be produced is next separated from the ingot 2 along this broken portion. There will now be described the procedure of forming the broken portion in the ingot 2 and separating the wafer from the ingot 2 along the broken portion with reference to FIGS. 5A to 7B.

(First Ultrasonic Vibration Applying Step)

Figure 5A:
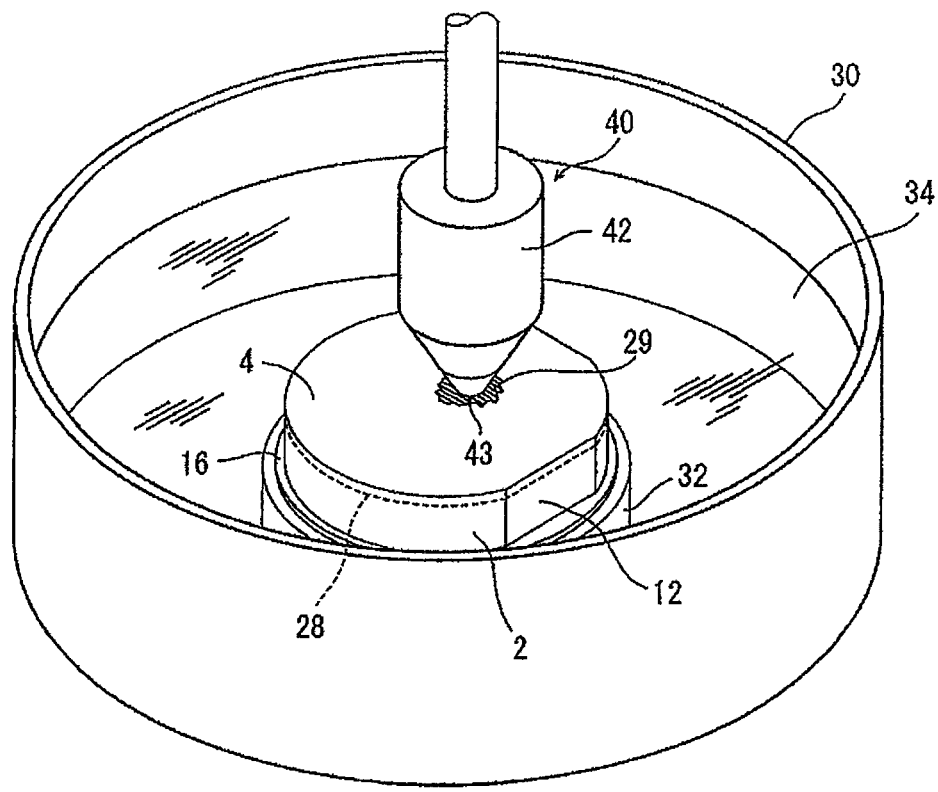
FIG. 5A is a perspective view depicting a first ultrasonic vibration applying step using high-density ultrasonic vibration generating means.
Figure 5B:
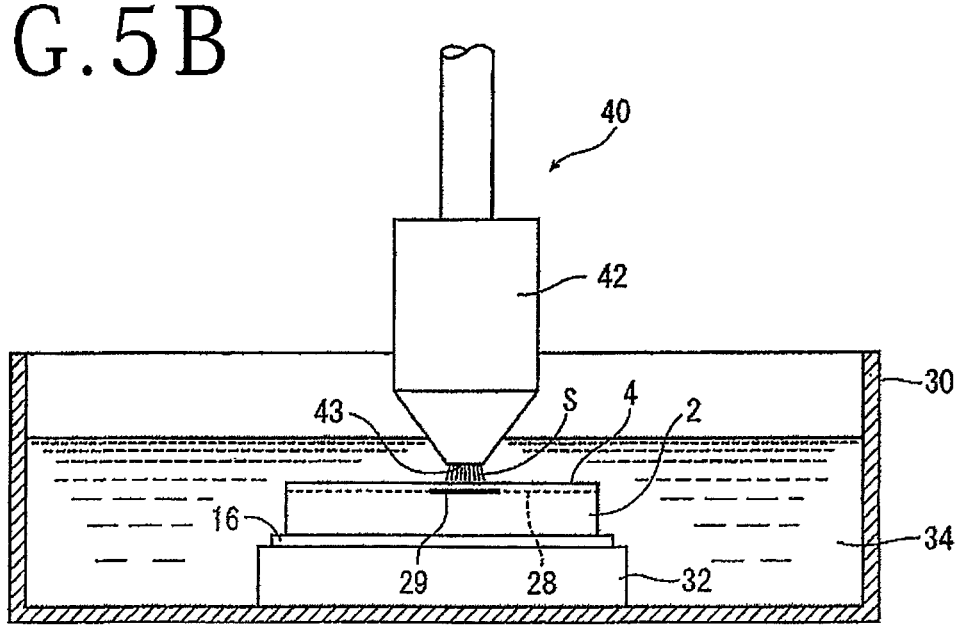
FIG. 5B is a sectional view depicting the first ultrasonic vibration applying step depicted in FIG. 5A.

First, a first ultrasonic vibration applying step is performed to apply high-density ultrasonic vibration to a given area of the ingot 2 including the wafer to be produced, thereby forming a partially broken portion where a part of the separation layer 28 is broken. In the first ultrasonic vibration applying step, an ultrasonic vibration generating apparatus 40 including a water bath 30 is prepared as depicted in FIG. 5A. A holding table 32 is provided on the bottom of the water bath 30. The holding table 32 has a flat upper surface for holding the ingot 2. After preparing the water bath 30, the ingot 2 with the substrate 16 is placed on the holding table 32 in the condition where the first end surface 4 of the ingot 2 is oriented upward, in which the separation layer 28 has already been formed in the ingot 2. After placing the ingot 2 on the holding table 32, water 34 is poured into the water bath 30 until the level of the surface of the water 34 in the water bath 30 becomes sufficiently higher than the level of the first end surface 4 of the ingot 2 as depicted in FIG. 5B. While FIG. 5B is a sectional view depicting the first ultrasonic vibration applying step, only the water bath 30 is depicted in vertical section for convenience of illustration.

The ultrasonic vibration generating apparatus 40 includes high-density ultrasonic vibration generating means 42. The high-density ultrasonic vibration generating means 42 incorporates an ultrasonic vibrator (not depicted) for generating ultrasonic vibration S. The lower end portion of the high-density ultrasonic vibration generating means 42 is tapered to form a high-density ultrasonic vibration applying portion 43. The high-density ultrasonic vibration applying portion 43 is a circular portion having a diameter of 8 mm, for example.

The ultrasonic vibration S to be generated by the high-density ultrasonic vibration generating means 42 has a power of 100 W and a frequency of 400 kHz, for example. According to the high-density ultrasonic vibration generating means 42, the ultrasonic vibration S generated by the ultrasonic vibrator is concentrated by the high-density ultrasonic vibration applying portion 43 having a tapering shape, so that the density of the ultrasonic vibration S is increased. Accordingly, the ultrasonic vibration S can be applied at a high density toward a target area.

In the condition where the ingot 2 is held on the holding table 32 and immersed in the water 34 in the water bath 30, the high-density ultrasonic vibration generating means 42 is lowered toward the first end surface 4 of the ingot 2. Thereafter, the high-density ultrasonic vibration applying portion 43 formed at the lower end portion of the high-density ultrasonic vibration generating means 42 is immersed into the water 34 in the water bath 30 and then set near the center of the first end surface 4 of the ingot 2. At this time, a small gap (e.g., several mm) is defined between the high-density ultrasonic vibration applying portion 43 and the first end surface 4 of the ingot 2.

After setting the high-density ultrasonic vibration applying portion 43 near the center of the first end surface 4 of the ingot 2 as mentioned above, the high-density ultrasonic vibration S is applied from the high-density ultrasonic vibration applying portion 43 through the layer of the water 34 toward the first end surface 4 of the ingot 2 for a predetermined period of time (e.g., approximately 10 seconds). Accordingly, as depicted in FIG. 5B, the high-density ultrasonic vibration S is concentratedly applied to the given area of the first end surface 4 of the ingot 2 including the wafer to be produced, thereby stimulating a part of the separation layer 28. As a result, a partially broken portion 29 is formed at this part of the separation layer 28 as depicted in FIG. 5B. That is, this part of the separation layer 28 is broken in the partially broken portion 29. In this manner, the first ultrasonic vibration applying step is completed.

(Second Ultrasonic Vibration Applying Step)

After completing the first ultrasonic vibration applying step, a second ultrasonic vibration applying step is performed. The second ultrasonic vibration applying step will now be described with reference to FIGS. 6A and 6B.

Figure 6A:
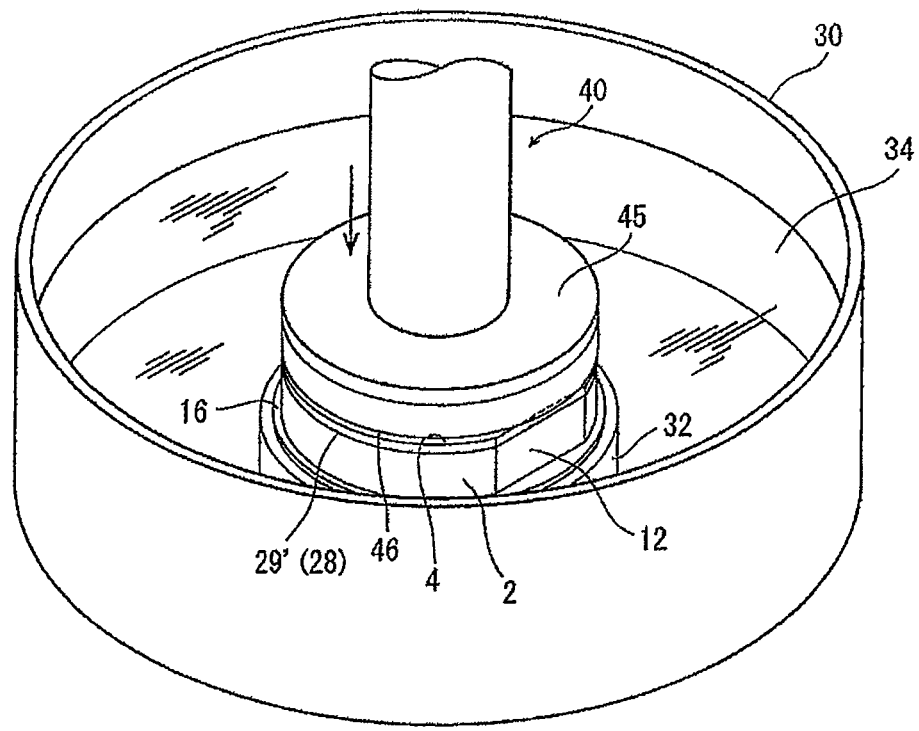
FIG. 6A is a perspective view depicting a second ultrasonic vibration applying step using low-density ultrasonic vibration generating means.

In performing the second ultrasonic vibration applying step, the high-density ultrasonic vibration generating means 42 used in the first ultrasonic vibration applying step is changed to low-density ultrasonic vibration generating means 45 depicted in FIG. 6A. As a method of changing the high-density ultrasonic vibration generating means 42 to the low-density ultrasonic vibration generating means 45, the high-density ultrasonic vibration generating means 42 may be first removed from the ultrasonic vibration generating apparatus 40, and the low-density ultrasonic vibration generating means 45 may be next mounted. As another method, the ultrasonic vibration generating apparatus 40 may include a mounter (not depicted) for mounting both the high-density ultrasonic vibration generating means 42 and the low-density ultrasonic vibration generating means 45, in which the mounter is configured so as to suitably select either the high-density ultrasonic vibration generating means 42 or the low-density ultrasonic vibration generating means 45. In this case, the high-density ultrasonic vibration generating means 42 may be first moved away from the position above the ingot 2, and the low-density ultrasonic vibration generating means 45 may be next set above the ingot 2.

Figure 6B:
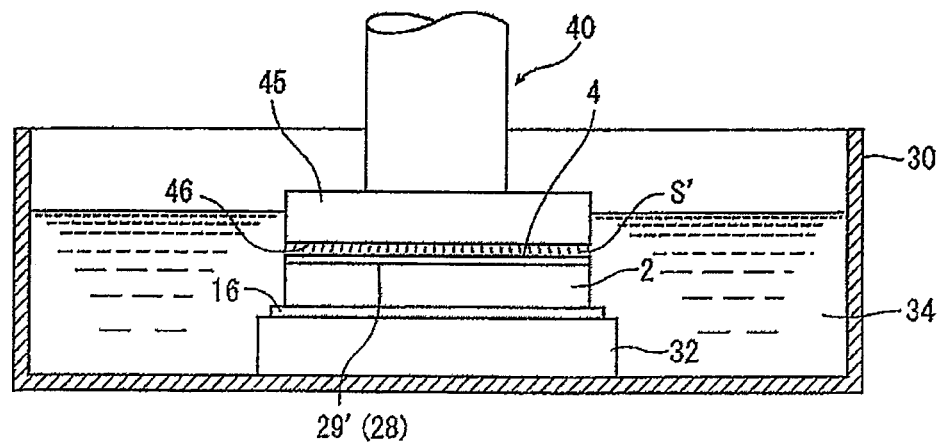
FIG. 6B is a sectional view depicting the second ultrasonic vibration applying step depicted in FIG. 6A.

As depicted in FIGS. 6A and 6B, the low-density ultrasonic vibration generating means 45 has a lower end portion formed as a low-density ultrasonic vibration applying portion 46. The low-density ultrasonic vibration applying portion 46 is opposed to the first end surface 4 of the ingot 2. The low-density ultrasonic vibration applying portion 46 has an area larger than the area of the high-density ultrasonic vibration applying portion 43 used in the first ultrasonic vibration applying step. More specifically, the low-density ultrasonic vibration applying portion 46 is a circular portion having a diameter of 100 mm, for example, which is substantially the same as the diameter of the ingot 2.

The low-density ultrasonic vibration generating means 45 is adapted to generate ultrasonic vibration S'. As similar to the high-density ultrasonic vibration generating means 42, the low-density ultrasonic vibration generating means 45 incorporates an ultrasonic vibrator (not depicted) for generating the ultrasonic vibration S'. For example, the ultrasonic vibration S' has a power of 100 W and a frequency of 400 kHz. As described above the area of the low-density ultrasonic vibration applying portion 46 is larger than the area of the high-density ultrasonic vibration applying portion 43. Accordingly, the density of the ultrasonic vibration S' to be applied from the low-density ultrasonic vibration applying portion 46 is lower than the density of the ultrasonic vibration S to be applied from the high-density ultrasonic vibration applying portion 43.

As depicted in FIG. 6A, the low-density ultrasonic vibration generating means 45 is positioned directly above the ingot 2 placed on the holding table 32 set in the water bath 30. In performing the second ultrasonic vibration applying step, the low-density ultrasonic vibration generating means 45 is lowered toward the first end surface 4 of the ingot 2 until the low-density ultrasonic vibration applying portion 46 of the low-density ultrasonic vibration generating means 45 is immersed into the water 34 stored in the water bath 30 and comes near the first end surface 4 of the ingot 2. Accordingly, the whole of the first end surface 4 of the ingot 2 is covered with the lower-density ultrasonic vibration applying portion 46. At this time, a small gap (e.g., several mm) is defined between the low-density ultrasonic vibration applying portion 46 and the first end surface 4 of the ingot 2.

In the condition where the low-density ultrasonic vibration applying portion 46 is set near the first end surface 4 of the ingot 2 as mentioned above, the low-density ultrasonic vibration S' is applied from the low-density ultrasonic vibration applying portion 46 through the layer of the water 34 toward the whole of the first end surface 4 of the ingot 2 for a predetermined period of time (e.g., approximately 30 seconds). By applying the low-density ultrasonic vibration S' to the whole of the first end surface 4 of the ingot 2 as mentioned above, the whole of the separation layer 28 formed inside the ingot 2 is stimulated by the low-density ultrasonic vibration S', so that the cracks 27 in the separation layer 28 extend from the partially broken portion 29 formed in the first ultrasonic vibration applying step and the adjacent cracks 27 are accordingly connected to each other, thereby forming a fully broken portion 29' where the separation layer 28 is fully broken. As depicted in FIG. 6B, the fully broken portion 29' is well formed in the whole of the separation layer 28 formed inside the ingot 2. Accordingly, the wafer to be produced can be reliably separated from the ingot 2 along the fully broken portion 29'. In this manner, the second ultrasonic vibration applying step is completed.

(Separating Step)

Figure 7A:
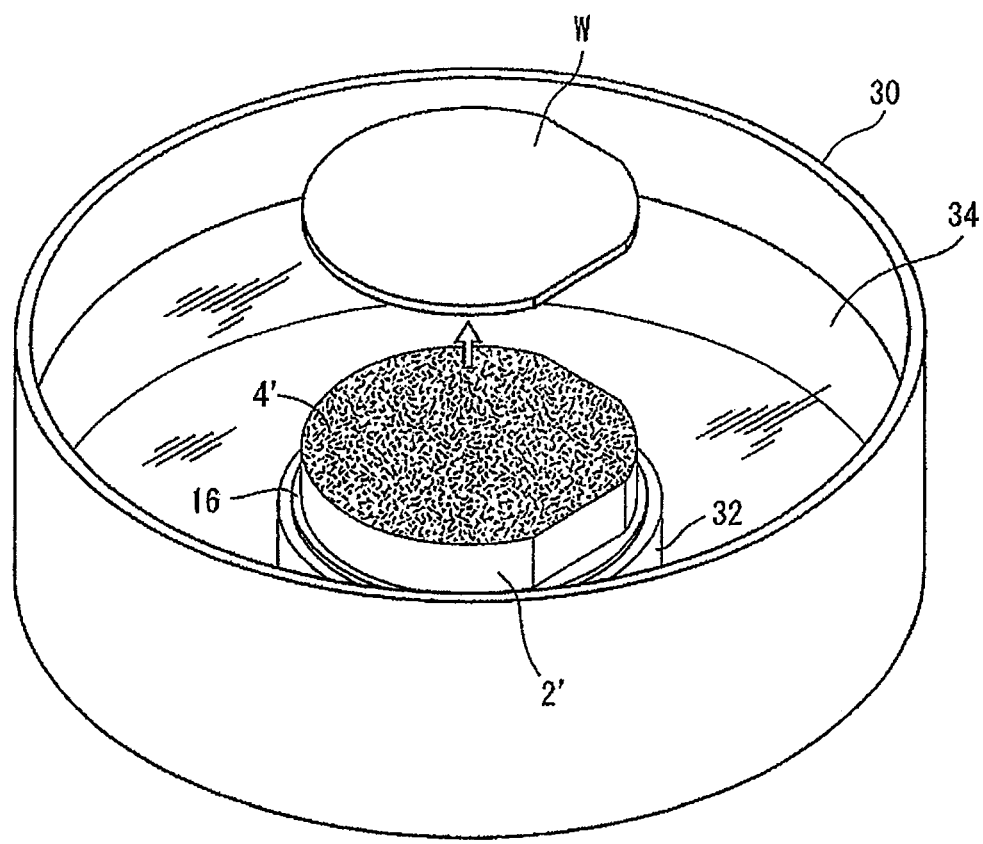
FIG. 7A is a perspective view depicting a separating step.
Figure 7B:
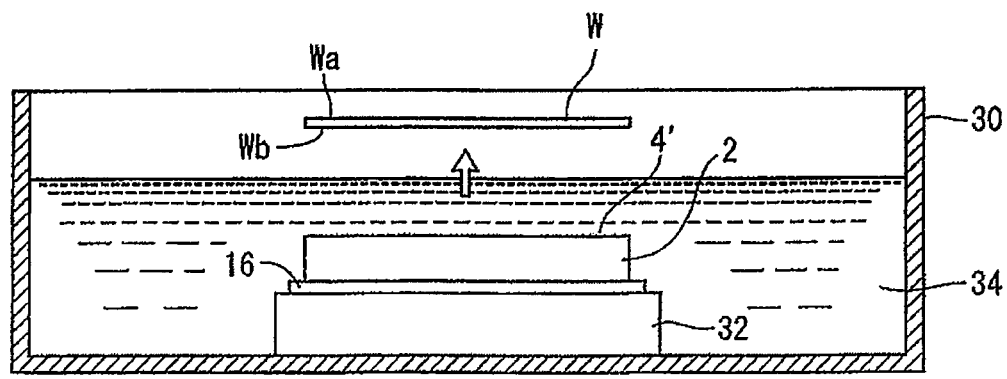
FIG. 7B is a sectional view depicting the separating step depicted in FIG. 7A.

After performing the first ultrasonic vibration applying step and the second ultrasonic vibration applying step to thereby form the fully broken portion 29' from the separation layer 28 formed inside the ingot 2, a separating step is performed to separate a wafer W from the ingot 2 along the fully broken portion 29', in which the ingot 2 remains immersed in the water 34 stored in the water bath 30. Accordingly, the wafer W has the first end surface 4 of the ingot 2 as a front side Wa as depicted in FIGS. 7A and 7B. In performing the separating step, the wafer W may be directly held and lifted by an operator. Alternatively, the wafer W may be held by suction means (not depicted) under suction and lifted from the water bath 30 by the suction means, in which the suction means has a size corresponding to the size of the wafer W.

In the condition where the wafer W has been separated from the ingot 2 by performing the separating step as mentioned above, the separation surface of the wafer W as a back side Wb is a rough surface, and the separation surface of the ingot 2 as a new first end surface 4' is also a rough surface. Accordingly, the back side Wb of the wafer W and the first end surface 4' of the ingot 2 are next polished to be flattened (not depicted). Thereafter, the wafer W separated from the ingot 2 is stored into a suitable case or the like and then transferred to any apparatus for performing a subsequent step. On the other hand, the ingot 2 having the first end surface 4' flattened is transferred to the laser processing apparatus 18 to perform the separation layer forming step again. After forming a separation layer in the ingot 2 by using the laser processing apparatus 18, the first ultrasonic vibration applying step, the second ultrasonic vibration applying step, and the separating step are performed again to thereby efficiently produce another wafer W from the ingot 2.

According to this preferred embodiment, the amount of the ingot 2 to be discarded in producing the wafer W from the ingot 2 can be greatly reduced as compared with the case of using a wire saw to slice the ingot 2. Further, the first ultrasonic vibration applying step is performed to apply the high-density ultrasonic vibration S to a part of the ingot 2, thereby forming the partially broken portion 29. Thereafter, the second ultrasonic vibration applying step is performed to apply the low-density ultrasonic vibration S' to the whole of the ingot 2, thereby forming the fully broken portion 29' as spread from the partially broken portion 29. Thus, the fully broken portion 29' is formed from the separation layer 28 previously formed in the ingot 2. Accordingly, the wafer W to be produced can be separated from the ingot 2 along the fully broken portion 29' easily and efficiently.

The present invention is not limited to the above preferred embodiment, but various modifications may be made. For example, while the c-axis in the ingot 2 as a workpiece is inclined with respect to the normal 10 to the first end surface 4 of the ingot 2 and the off angle α is formed between the c-plane and the first end surface 4 in the above preferred embodiment, the present invention is not limited to this configuration. That is, the present invention is applicable also to an ingot having a configuration such that the c-axis is not inclined with respect to the normal 10 to the first end surface 4.

Further, while ultrasonic vibration is applied from the ultrasonic vibration generating apparatus 40 through the layer of the water 34 to the ingot 2 in the first ultrasonic vibration applying step and the second ultrasonic vibration applying step in the above preferred embodiment, the layer of the water 34 may be replaced by a layer of air or a layer of liquid other than water.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing method for producing a wafer from an ingot after forming a separation layer inside the ingot by setting a focal point of a laser beam having a transmission wavelength to the ingot inside the ingot at a predetermined depth from one end surface of the ingot, the predetermined depth corresponding to a thickness of the wafer to be produced, and next applying the laser beam to the ingot, the wafer producing method comprising:

a first ultrasonic vibration applying step of applying ultrasonic vibration to a given area of the ingot at a first density to thereby form a partially broken portion where a part of the separation layer is broken;

a second ultrasonic vibration applying step of applying the ultrasonic vibration to a whole area of the ingot larger than the given area at a second density lower than the first density, after performing the first ultrasonic vibration applying step, thereby forming a fully broken portion where the separation layer is fully broken in such a manner that breaking starts from the partially broken portion; and a separating step of separating the wafer from the ingot along the fully broken portion.

2. The wafer producing method according to claim 1, wherein the ultrasonic vibration is applied through a layer of water to the ingot in the first ultrasonic vibration applying step and the second ultrasonic vibration applying step.

3. The wafer producing method according to claim 1, wherein the ingot includes a hexagonal single-crystal SiC ingot having a c-axis and a c-plane perpendicular to the c-axis, and the separation layer is composed of a modified portion and cracks extending isotropically from the modified portion along the c-plane, the modified portion being formed by setting a focal point of a laser beam having a transmission wavelength to hexagonal single-crystal SiC inside the SiC ingot at a predetermined depth from the one end surface of the SiC ingot, the predetermined depth corresponding to the thickness of the wafer to be produced, and next applying the laser beam to the SiC ingot to thereby decompose SiC into Si and C.

4. The wafer producing method according to claim 3, wherein the c-axis is inclined at an off angle with respect to a normal to the one end surface of the SiC ingot, the off angle being formed between the c-plane and the one end surface, the focal point of the laser beam is moved in a direction perpendicular to a direction of formation of the off angle to thereby continuously form the modified portion in the direction perpendicular to the direction of formation of the off angle, and the focal point of the laser beam is indexed in the direction of formation of the off angle in a range not greater than a range of formation of the cracks, wherein a plurality of linear modified portions are arranged side by side in the direction of formation of the off angle in such a manner that the cracks extending from any adjacent ones of the plurality of linear modified portions are overlapped.

\* \* \* \* \*